United States Patent
Colosi

(10) Patent No.: US 12,096,558 B2
(45) Date of Patent: Sep. 17, 2024

(54) CIRCUIT BOARD FASTENERS AND THEIR ASSEMBLY

(71) Applicant: Penn Engineering & Manufacturing Corp., Danboro, PA (US)

(72) Inventor: Anthony Colosi, Quakertown, PA (US)

(73) Assignee: Penn Engineering & Manufacturing Corp., Danboro, PA (US)

( * ) Notice: Subject to any disclaimer, the term of this patent is extended or adjusted under 35 U.S.C. 154(b) by 368 days.

(21) Appl. No.: 17/547,853

(22) Filed: Dec. 10, 2021

(65) Prior Publication Data

US 2022/0192021 A1 Jun. 16, 2022

Related U.S. Application Data

(60) Provisional application No. 63/124,433, filed on Dec. 11, 2020.

(51) Int. Cl.
*H05K 1/14* (2006.01)
(52) U.S. Cl.
CPC ...................................... *H05K 1/14* (2013.01)
(58) Field of Classification Search
CPC ........................................................ H05K 1/14
USPC ......................................................... 361/784
See application file for complete search history.

(56) References Cited

U.S. PATENT DOCUMENTS

| | | | | |
|---|---|---|---|---|
| 5,669,774 | A * | 9/1997 | Grabbe | H05K 7/1084 439/70 |
| 2008/0007608 | A1 * | 1/2008 | Smith | H05K 3/32 347/111 |
| 2008/0182436 | A1 * | 7/2008 | Rathburn | H05K 3/3426 439/78 |
| 2009/0127698 | A1 | 5/2009 | Rathburn | |
| 2012/0009827 | A1 | 1/2012 | Hasegawa | |
| 2013/0125372 | A1 | 5/2013 | van Niekerk et al. | |

FOREIGN PATENT DOCUMENTS

CN 211343624 U 8/2020

* cited by examiner

*Primary Examiner* — Binh B Tran
(74) *Attorney, Agent, or Firm* — Gregory J. Gore, Esq.

(57) ABSTRACT

A fastening system comprises two interconnecting components for fastening electronic components which can be joined by snap-fit when a fastener component is pressed against a retainer. The fastening system consists of a fastener stud with a planar base at the bottom and an upwardly extending shank with a neck portion of reduced diameter adjacent the base. The stud has a spherical ball portion with a flat planar top surface at a distal top end. The fastener stud mates with a retainer having a planar base and affixed opposing resilient arms extending orthogonally from the base centered about a rotational axis. The arms preferably have compound shaped inner surfaces symmetrical about the axis. These surfaces comprise a cylindrical portion adjacent the base and a spherical portion adjacent the distal ends of the arms.

12 Claims, 2 Drawing Sheets

CIRCUIT BOARD FASTENERS AND THEIR ASSEMBLY

RELATED APPLICATIONS

This is a non-provisional patent application related to provisional patent application Ser. No. 63/124,433, entitled, "Circuit Board Fasteners and Their Assembly" filed on Dec. 11, 2020 priority from which is hereby claimed.

FIELD OF INVENTION

The present invention relates to two-part fastener systems which have separable components that releasably join together. More specifically it relates to surface mounted metal fasteners of this type used to join circuit boards in spaced relation to each other.

BACKGROUND OF THE INVENTION

In the field of circuit board fasteners, it is known to use fasteners soldered or otherwise affixed to a circuit board to join two circuit boards spaced apart. For various reasons these fasteners have various drawbacks in meeting the requirements of modern high-speed robotic assembly. Those requirements include compatibility with pick-and-place robotics, delivery to the installation site by tape-and-reel feed, and circuit board surface mount soldering technology.

SUMMARY OF THE INVENTION

It is therefore the main objective of the present invention to overcome the present drawbacks in the field of circuit board fastening as explained above. As further described below in the drawings and description of one preferred embodiment of the invention, the present system consists of a fastener pair of two separate mating components. One of the components is a fastener stud with a ball end and the other is a retainer which receives the ball end by snap fit. These components utilize surface mount technology in an effective way that accomplishes the following attributes:
1. The two components of the fastener assembly pair are mounted separately but can be assembled on a center axis.
2. The fastener pair allows for assembly and disassembly by hand for several cycles without the need for tools.
3. The fastener pair can be assembled at an angle (orthogonal or non-orthogonal approach angle).
4. The fastener pair can be made available on tape-and-reel feed and mounted via SMT (solderable surface mount technology).
5. The components can act as a spacer that holds a tight-tolerance assembled height.
6. The fastener pair can be oriented at an angle about the axis of assembly upon placement.

More specifically, the applicant has invented two interconnecting components for fastening electronic components which can be joined by snap-fit when the fastener component is pressed against a retainer. The fastening system comprises a fastener stud with a planar base at the bottom and an upwardly extending shank with a neck portion of reduced diameter adjacent the base. The stud has a spherical ball portion with a flat planar top surface at a distal top end. The fastener stud mates with a retainer having a planar base and affixed opposing resilient arms extending orthogonally from the base centered about a rotational axis. The arms preferably have compound shaped inner surfaces symmetrical about the axis. These surfaces comprise a cylindrical portion adjacent the base and a spherical portion adjacent the distal ends of the arms. The retainer and fastener are constructed and arranged such that the fastener is received between the retainer arms by releasable snap fit. The spherical portion of the retainer arms inside surface preferably matches the contour of the fastener ball portion adjacent the fastener neck.

In some embodiments the top of the fastener stud abuts the retainer base and there are only two retainer arms. The retainer base can have an outer surface of the retainer base is planar and orthogonal to the axis and an outer surface of the fastener base is planar and orthogonal to the axis as well. The outer surfaces of the retainer and fastener bases are preferably adapted for surface mount soldering and pick-and-place transportation during electronic component manufacturing where the fastener and/or the retainer is soldered to an electronic component such as a circuit board.

Greater stability of the joined fastener and retainer can be provided by a construction of the parts where an inner surface of the retainer base is planar and in abutment with the fastener top while the ends of the retainer arms are located adjacent the neck portion and in between the spherical portion and the base of the fastener.

Other objects and advantages will be apparent to those in the field of electronic fastener arts from the following drawings and description of the disclosed embodiments.

DESCRIPTION OF THE PREFERRED EMBODIMENT

Figure 1:
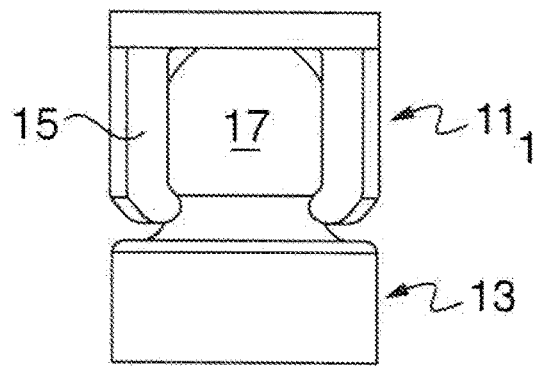
FIG. 1 is a front elevation view of the assembled fastener and retainer.
Figure 2:
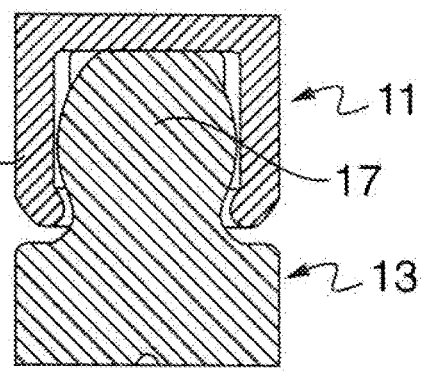
FIG. 2 is a sectional view taken from FIG. 1 as shown in that figure.

Referring to FIGS. 1 and 2, the two main elements of the invention, a retainer 11 and a fastener stud 13, are shown in their assembled condition. The retainer has flexible resilient arms 15 that capture a spherical ball end 17 of a fastener shank by non-destructive releaseable snap fit. The arms 15 bend when they interfere with the fastener ball surface to receive the fastener shank when pressed together upon assembly. The arms have sufficient elasticity to return to an assembled resting position as shown in the cross-section seen in FIG. 2. The ends of the arms are located immediately adjacent a fastener stud neck portion and in between the spherical portion of the fastener stud and its base. The distal ends of the retainer arms extend inwardly and are axially rounded to match the contour of the neck portion as seen in FIGS. 1 and 2.

Figure 3:
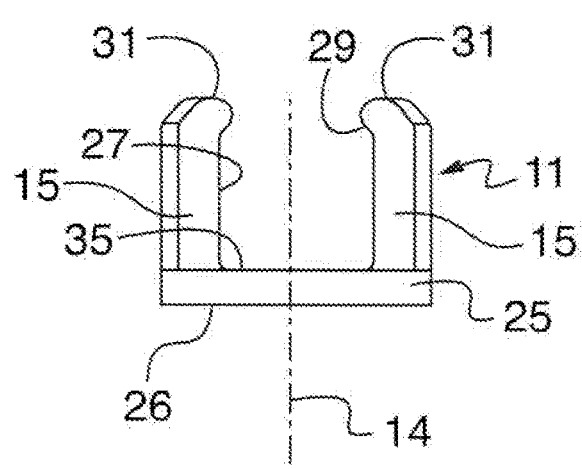
FIG. 3 is a front elevation view of the retainer element.

Referring now to FIG. 3, the retainer 11 is shown in isolation. The retainer 11 comprises a planar base 25 and affixed opposing resilient arms 15 extending orthogonally from the base 25 centered about a rotational axis 14. The arms have compound shaped inner surfaces symmetrical about the axis consisting of a cylindrical portion 27 adjacent the base 25 and a spherical portion 29 adjacent rounded distal ends 31 of the arms. The base 25 has a flat bottom surface 26. The cylindrical portion provides the lateral capture of the stud over a range of axial spacing.

Figure 4:
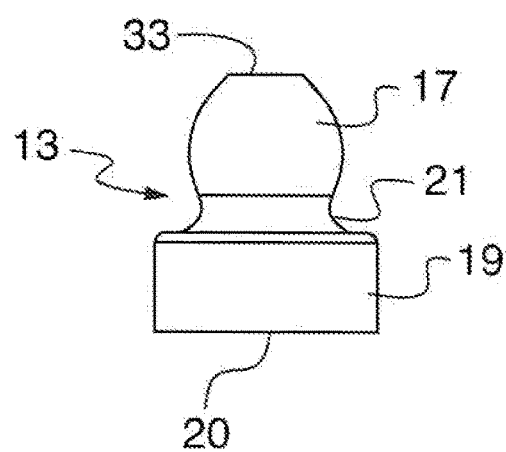
FIG. 4 is a front elevation of the fastener stud element.

As seen in FIG. 4, the fastener stud has a shank that extends upwardly from a base 19, and further consists of a neck portion 21 and a partially spherical ball end 17. The fastener stud has a flat top 33 and a flat bottom surface 20. When assembled, as seen in FIG. 1, the parts will be aligned with a planar flat top 33 of the spherical portion 17 of the fastener in flush abutment with the planar inner surface 35 of the base 25 of the retainer. This construction provides a fixed spacer height for the mated affixed structures such as circuit boards to which the bases 25 and 19 of the individual elements are separately attached at outer surfaces 26 and 20 respectively. The abutment of the mating flat surfaces also provides greater stability of components affixed to outer surfaces of the interconnecting fastener/retainer assembly by resisting off-axis tipping of the assembly. The retainer 11 can be revolved about a rotational assembly axis defined by axis 14 as seen in FIG. 3.

The flat surfaces seen in FIGS. 3 and 4 reveal the SMT (surface mount technology) compatibility aspects of the invention. Seen in these figures are surfaces 35, 26, 33 and 20 which are the primary pick-and-place surfaces translating each part by an applied vacuum. In cases where the vacuum nozzle may not fit between the arms of the retainer, a patch may be applied at the top of the arms for transfer using that surface. For SMT compatibility, the parts can be soldered on the outer surfaces 26 and 20 of bases 25 and 19 respectively.

Figure 5:
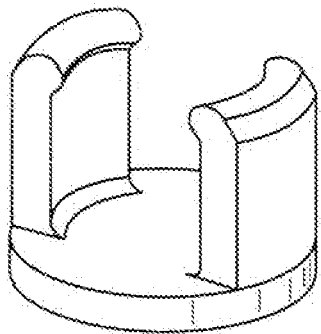
FIGS. 5, 6, and 7 are top front perspective views showing various rotational positions of the retainer element shown in isolation.
Figure 6:
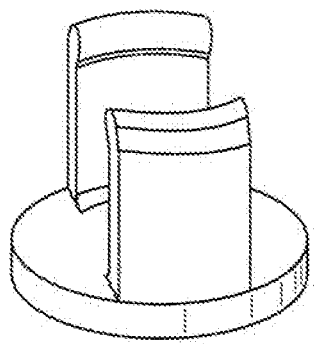
Figure 7:
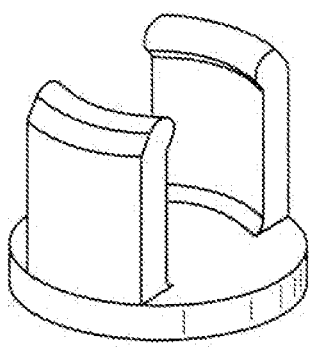

FIGS. 5, 6, and 7 show different orientations of the retainer. The invention allows for assembly at any orientation of the retainer about the assembly axis so long as the ball-end fastener is aligned axially as well. This eliminates the need for precise alignment when placing the part on the PCB.

Figure 8:
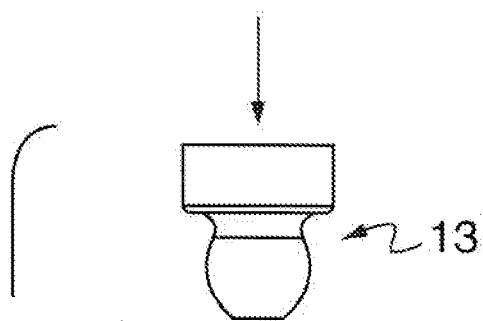
FIG. 8 is a side elevation view showing the orientation of the fastener and retainer elements in an orthogonal assembly position.
Figure 9:
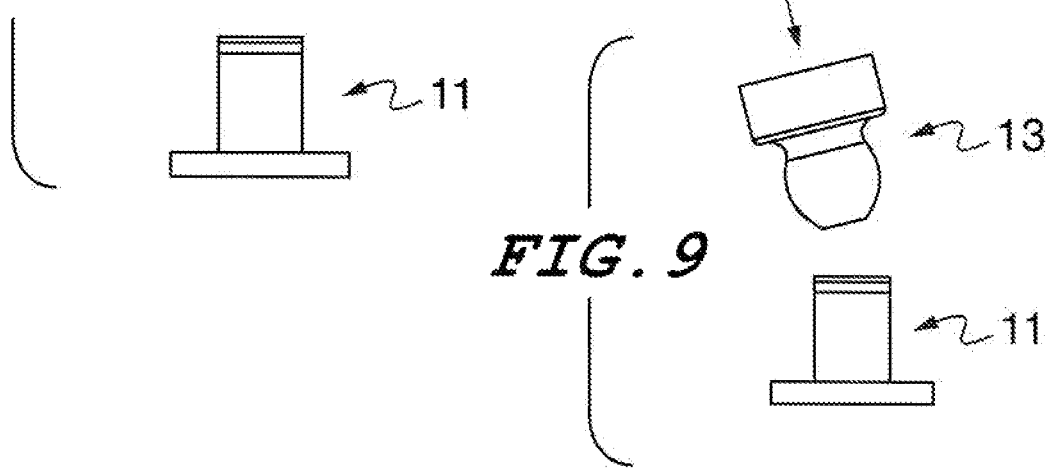
FIG. 9 is a side elevation view showing a non-orthogonal assembly position of the elements prior to assembly.

Referring now to FIGS. 7 and 8, FIG. 7 shows an example of an orthogonal assembly which occurs when assembling by pressing the parts 11 and 13 together along the assembly axis as shown by the direction arrow. FIG. 8 shows a non-orthogonal assembly which occurs when the components are assembled by being pressed together at an angle askew to the vertical rotational axis of the retainer. The axially rounded contact points of the retainer and rounded surface of the fastener ball allow for this non-orthogonal assembly.

From the foregoing it will be apparent to those of skill in the art that the functional advantages and objectives of the invention have been achieved. It should be understood that the embodiment shown represents but one possible manifestation of the invention. There are other variations and alterations that are possible which utilize the basic principles of operation of the fastening system described herein without departing from the scope and spirit of the invention which is determined by the following claims and their legal equivalents.

What is claimed is:

1. A fastening assembly consisting of two interconnected elements for joining electronic components, compromising:
    a fastener stud with a planar base at the bottom and an upwardly extending shank with a neck portion of reduced diameter adjacent the base, the shank having a spherical ball portion with a flat planar top at a distal top end of the fastener stud;
    a retainer with a planar base and having affixed opposing resilient arms extending orthogonally from the base centered about a rotational axis, said arms having compound shaped inner surfaces symmetrical about the axis consisting of a cylindrical portion adjacent the base and a spherical portion adjacent the distal ends of the arms;
    wherein the retainer arms and fastener stud are joined by non-destructive releaseable snap-fit; and
    wherein an inner surface of the retainer base is flat and in face-to-face abutment with the fastener stud flat planar top.

2. The assembly of claim 1 wherein the top of the fastener stud abuts the retainer base.

3. The assembly of claim 1 wherein there are only two arms.

4. The assembly of claim 1 wherein an outer surface of the retainer base is planar and orthogonal to the axis.

5. The assembly of claim 4 wherein an outer surface of the fastener stud base is planar and orthogonal to the axis.

6. The assembly of claim 5 wherein the outer surfaces of the retainer and fastener stud bases are adapted for surface mount soldering and pick-and-place transportation.

7. The assembly of claim 6 wherein the fastener stud and/or the retainer is soldered to an electronic component.

8. The assembly of claim 7 wherein the electronic component is a circuit board.

9. The assembly of claim 1 wherein the ends of the arms extend inwardly and are located immediately adjacent the fastener stud neck portion and in between the spherical portion of the fastener stud and its base.

10. The assembly of claim 9 wherein the inner surface of the ends of the arms matches the contour of the fastener stud ball portion.

11. The assembly of claim 10 wherein the fastener stud and the retainer are constructed and adapted such that they are joined when the fastener stud is pressed against the retainer arms askew to the rotational axis.

12. The assembly of claim 9 wherein the distal ends of the retainer arms are axially rounded and match the contour of the neck portion.

* * * * *